US006818329B1

(12) United States Patent
Liao et al.

(10) Patent No.: US 6,818,329 B1
(45) Date of Patent: Nov. 16, 2004

(54) ORGANIC ELECTROLUMINESCENT DEVICES HAVING A METAL SUB-LAYER WITHIN A HOLE-TRANSPORTING REGION

(75) Inventors: Liang-Sheng Liao, Rochester, NY (US); Joseph K. Madathil, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/678,856

(22) Filed: Oct. 3, 2003

(51) Int. Cl.$^7$ ............................................. H05B 33/12
(52) U.S. Cl. ...................... 428/690; 428/917; 313/504; 313/506
(58) Field of Search .............................. 428/690, 917; 313/504, 506

(56) References Cited

U.S. PATENT DOCUMENTS

| 4,769,292 A | 9/1988 | Tang et al. |
| 5,343,050 A | 8/1994 | Egusa et al. |

OTHER PUBLICATIONS

Tang et al, Electroluminescence of doped organic thin films, J. Appl. Phys. 65 (9), May 1989, pp. 3610–3616.
Adachi et al, Electroluminescence in Organic Films with Three–Layer Structure, Japanese Journal of Applied Physics, vol. 27, No. 2, Feb. 1988, pp. L269–L271.
Tang et al, Organic electroluminescent diodes, Appl. Phys. Lett. 51 (12) Sep. 1987, pp. 913–915.
Zhou et al, Very–low–operating organic light–emitting diodes using a p–doped amorphous hole injection layer, Appl. Phys. Letters, Jan. 2001, pp. 410–412.
Shirota et al, Multilayered organic electroluminescent device using a novel starburst molecule, 4,4'4"–tris(3–methylphenylphenylamino)triphenylamine, as a hole transport material, Appl. Phys. Lett. 65 (7), Aug. 1994, pp. 807–809.

*Primary Examiner*—Dawn Garrett
(74) *Attorney, Agent, or Firm*—Raymond L. Owens (57) ABSTRACT

An organic electroluminescent device including an anode; a hole-transporting region disposed over the anode; wherein the hole-transporting region contains at least one hole-transporting material; a metal sub-layer disposed within the hole-transporting region; wherein the metal sub-layer contains at least one metal selected from group 4 through group 16 of the Periodic Table of Elements and the selected metal has a work-function higher than 4.0 eV; a light-emitting layer formed in contact with the hole-transporting region for producing light in response to hole-electron recombination; an electron-transporting layer disposed over the light-emitting layer; and a cathode disposed over the electron-transporting layer.

11 Claims, 5 Drawing Sheets

ORGANIC ELECTROLUMINESCENT DEVICES HAVING A METAL SUB-LAYER WITHIN A HOLE-TRANSPORTING REGION

FIELD OF INVENTION

The present invention relates to improving the performance of an organic electroluminescent (EL) device, especially relates to improving the luminous efficiency of an EL device.

BACKGROUND OF THE INVENTION

Organic electroluminescent (EL) devices or organic light-emitting devices (OLEDs) are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al. demonstrated highly efficient OLEDs using such a layer structure in "Organic Electroluminescent Diodes", *Applied Physics Letters*, 51, 913 (1987) and in commonly assigned U.S. Pat. No. 4,769,292. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics*, 27, L269 (1988), and by Tang et al., "Electroluminescence of Doped Organic Thin Films", *Journal of Applied Physics*, 65, 3610 (1989). The LEL commonly consists of a host material doped with a guest material. Further, there are other multi-layer OLEDs that contain additional functional layers, such as a hole-injecting layer (HIL), and/or an electron-injecting layer (EIL), and/or an electron-blocking layer (EBL), and/or a hole-blocking layer (HBL) in the devices. At the same time, many different types of EL materials are also synthesized and used in OLEDs. These new structures and new materials have further resulted in improved device performance.

One of the ways to improve luminous efficiency is to modify hole-transporting region (HTR) in OLEDs. A conventional OLED structure is shown in FIG. 1A, wherein OLED 100 includes an anode 120, an HTR 131, a LEL 134, an ETL 138, and a cathode 140. This device is externally connected to a voltage/current source 150 through electrical conductors 160. This device only has one HTL in the HTR, and it usually cannot produce high luminous efficiency due to un-balanced carrier injection into the LEL. In order to obtain high luminous efficiency, people are trying to use more than one HTL in OLEDs. Shown in FIG. 2B is another type of OLED structure disclosed in prior art, wherein the HTR 131 of OLED 200 contains more than one HTLs, i.e. HTL 1, . . . HTL n, (n>1, an integer). HTL 1 is denoted as HTL 131.1, HTL 2 is denoted as HTL 131.2, and HTL n is denoted as HTL 131.$n$ in the Figures. Shirota et al. reported in "Multilayered Organic Electroluminescent Devices Using a Novel Starburst Molecule, 4,4',4"-Tris(3-Methylphenylphenylamino)Triphenylamine, as a Hole Transport Material", *Applied Physics Letters*, 65, 807 (1994) that an OLED with dual HTLs could increase efficiency and lifetime. They achieved higher efficiency and longer lifetime when using dual HTLs, 4,4',4"-tris(3-methylphenylphenylamino)triphenylamine (m-TDATA)/4,4'-bis(3-methylphenylphenylamino)biphenyl (TPD) than those when using a single TPD layer as an HTL in their device. Egusa et al. in U.S. Pat. No. 5,343,050 shows an OLED structure containing more than two hole-transporting layers. Moreover, doped HTL (or doped HIL) is used in HTR to improve the luminous efficiency of OLED. For example, Zhou et al. reported in "Very-Low-Operating-Voltage Organic Light-Emitting Diodes Using a p-Doped Amorphous Hole Injection Layer", *Applied Physics Letters*, 78, 410 (2001) that high luminance efficiency and low drive voltage can be achieved in an OLED having an HIL comprising tetrafluoro-tetracyano-quinodimethane (F4-TCNQ) doped 4,4',4"-tris(N,N-diphenyl-amino)triphenylamine (TDATA) in contact with both an anode and an HTL.

Using the aforementioned methods can effectively enhance the luminous efficiency of an OLED. However, multiple HTL structures cannot substantially improve the lifetime of the device. Instead, it usually shortens the lifetime of the device. Shown in FIGS. 1B and 2B are the schematic electron energy band diagrams of FIGS. 1A and 2A, respectively. As is known, the most commonly used anode, indium tin oxide (ITO), can have a work-function of about 5.0 eV with some proper surface treatments, and a TPD layer has an ionization potential (Ip) of about 5.6 eV. When a single TPD layer is used as an HTL in adjacent to ITO in an OLED, it creates an energy barrier of higher than 0.6 eV for hole-injection at the interface of ITO/TPD, and this high energy barrier can cause a fast interface damage during operation, resulting in short operational lifetime. In Shirota's paper, an m-TDATA layer is used as another HTL between ITO and the TPD layer. Since m-TDATA layer has an Ip of about 5.1 eV, it forms an energy barrier of about 0.1 eV at the interface of ITO/m-TDATA. This low hole-injection barrier will not easily cause interface damage during operation. Therefore, the half-brightness lifetime of the OLED using m-TDATA/TPD layers as dual HTLs increases from 150 hrs to 300 hrs with an initial luminance of 300 cd/m$^2$. Moreover, another energy barrier of about 0.5 eV is formed at the interface of m-TDATA/TPD. Although this barrier accumulates holes and slow down the transport of holes into the LEL resulting in high luminous efficiency, this barrier is also limits further improvement of device lifetime. A conventional OLED, having an N,N'-bis(1-naphthyl)-N,N'-diphenyl-1,1'-biphenyl-4,4'-diamine (NPB) layer as a single HTL and a tris(8-hydroxyquinoline) aluminum (Alq) layer as an ETL, usually has a half-brightness life time longer than 5,000 hrs with an initial luminance of 300 cd/m$^2$. The substantial increase in lifetime is mainly due to the fact that NPB has an Ip of about 5.4 eV, and it forms a lower energy barrier at the interface of ITO/NPB compared to ITO/TPD, as well as due to the higher glass transition temperature of NPB than that of TPD. When NPB HTL is replaced by dual HTLs, the lifetime of the device can actually be reduced. If more than two HTLs are used in OLED and if the hole-injection barriers are not low enough to reduce interface damage at each interface in the HTR, lifetime of the OLED may not be improved. Moreover, F4-TCNQ is not thermally stable in its host layer, and it can diffuse from its host layer into the LEL to quench the luminance and to shorten the device lifetime. Furthermore, the fabrication of multiple HTLs or doped HTL (or doped HIL) needs more material sources in an evaporation chamber and needs longer device fabrication time, especially when more than two HTLs are fabricated.

SUMMARY OF THE INVENTION

It is therefore an object of the present invention to improve the luminous efficiency of an OLED.

It is another object of the present invention to simplify the layer structure of an OLED.

It is yet another object of the present invention to reduce the number of the materials sources needed for the fabrication of an OLED.

These objects are achieved by an organic electroluminescent device comprising:

a) an anode;

b) a hole-transporting region disposed over the anode; wherein the hole-transporting region contains at least one hole-transporting material;

c) a metal sub-layer disposed within the hole-transporting region; wherein the metal sub-layer contains at least one metal selected from group 4 through group 16 of the Periodic Table of Elements and the selected metal has a work-function higher than 4.0 eV;

c) a light-emitting layer formed in contact with the hole-transporting region for producing light in response to hole-electron recombination;

d) an electron-transporting layer disposed over the light-emitting layer; and e) a cathode disposed over the electron-transporting layer.

The present invention makes use of a metal sub-layer in the HTR where the metal sub-layer contains a metal having a work-function higher than 4.0 eV. By this arrangement, an OLED can have a higher luminous efficiency compared to conventional OLEDs without compromising the operational lifetime. It also needs fewer material sources to fabricate this OLED compared to the fabrication of the OLED having multilayered HTLs. It is also unexpectedly found that this metal sub-layer will not cause a metal diffusion problem in the device.

BRIEF DESCRIPTION OF THE DRAWINGS

FIG. 1A shows a cross-sectional view of a prior art OLED;

FIG. 1B shows a corresponding energy band diagram of a prior art OLED in FIG. 1A;

FIG. 2A shows a cross-sectional view of another prior art OLED having multilayered HTLs in the HTR;

FIG. 2B shows a corresponding energy band diagram of another prior art OLED having multilayered HTLs in the HTR in FIG. 2A;

FIG. 3A shows a cross-sectional view of an OLED in accordance with the present invention having a metal sub-layer in the HTR;

FIG. 3B shows a corresponding energy band diagram of the structure of FIG. 3A;

FIG. 4 is a graph showing normalized luminance versus operational time demonstrating the operational stability of the OLEDs fabricated in accordance with the prior art having multiple HTLs in the HTR;

FIG. 5 is a graph showing normalized luminance versus operational time demonstrating the operational stability of the OLEDs fabricated in accordance with the prior art having an organic sub-layer within the HTR;

FIG. 6 is a graph showing normalized luminance versus operational time demonstrating the operational stability of the OLEDs fabricated in accordance with the present invention as well as the prior art; and FIG. 7 is a graph showing normalized luminance versus operational time demonstrating the operational stability of the other OLEDs fabricated in accordance with the present invention as well as the prior art.

Since device feature dimensions such as layer thicknesses are frequently in sub-micrometer ranges, the drawings of FIGS. 1A to 3B are scaled for ease of visualization rather than dimensional accuracy.

DETAILED DESCRIPTION OF THE INVENTION

Figure 1A:
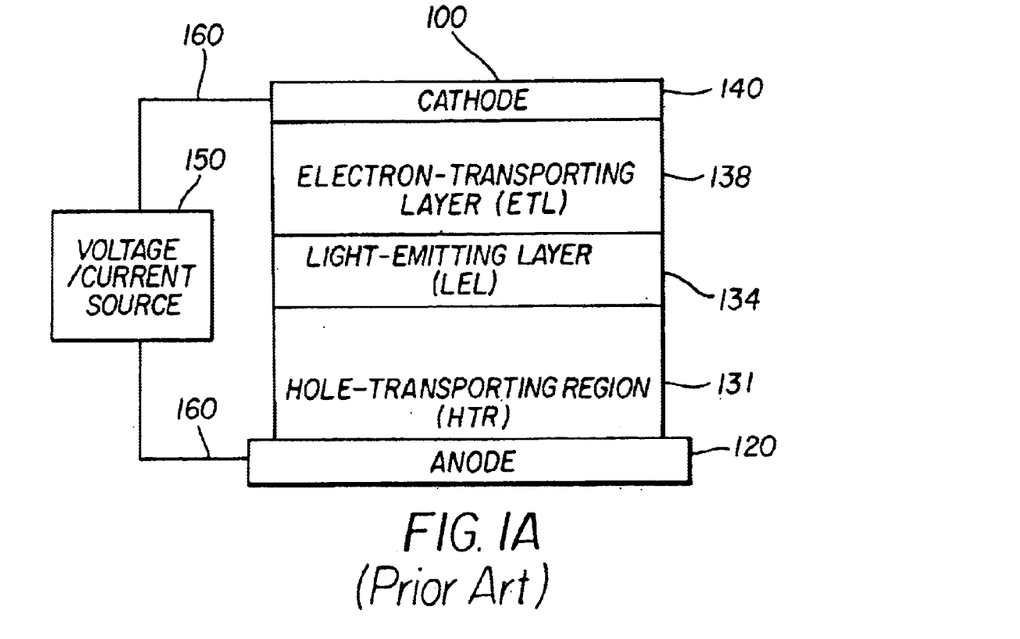
Figure 1B:
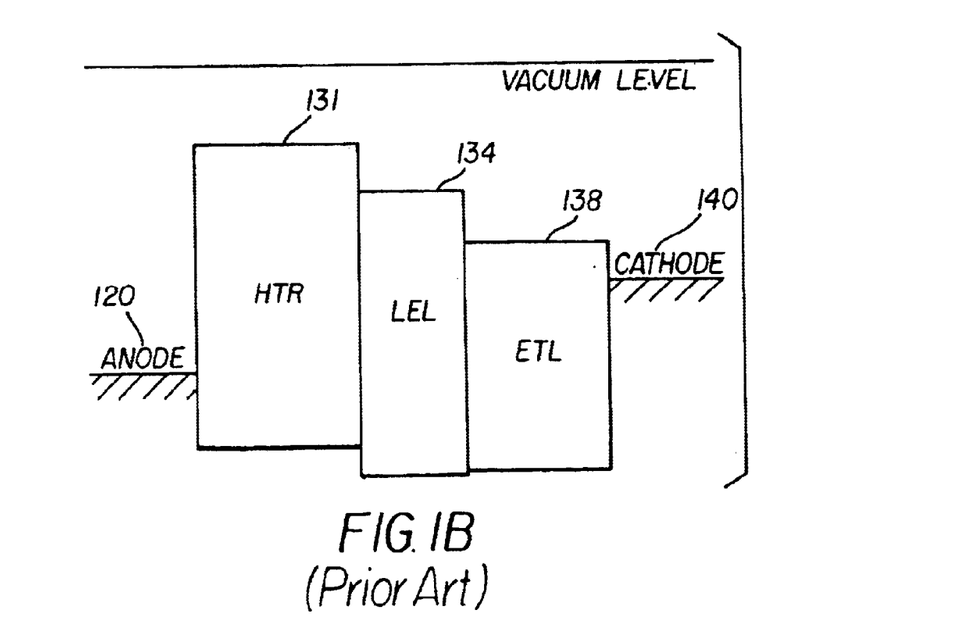
Figure 2A:
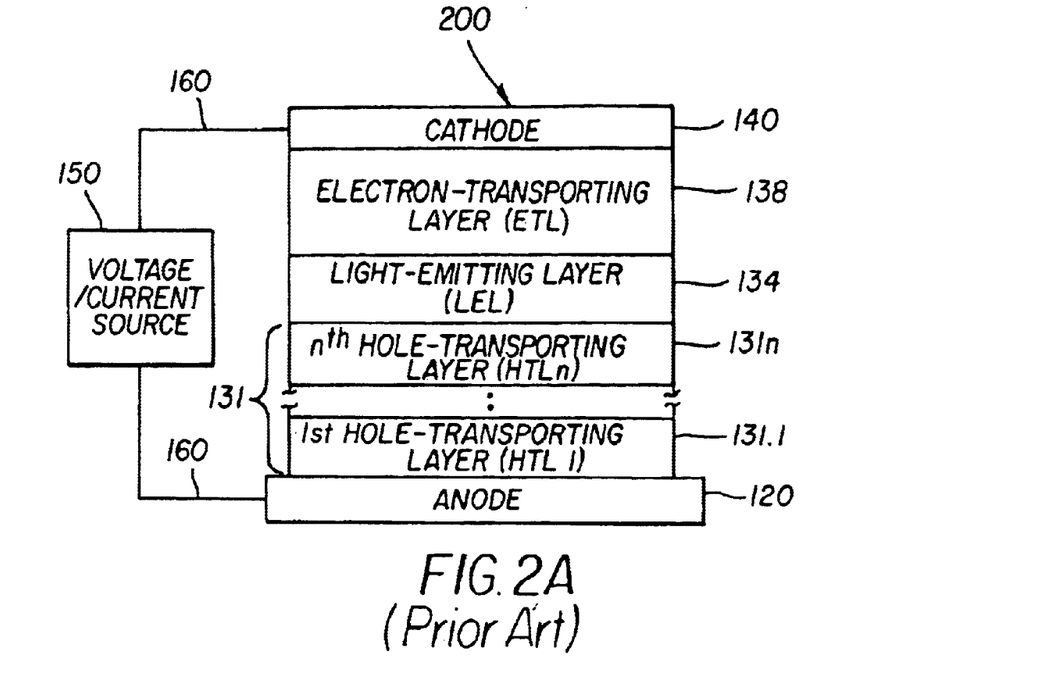
Figure 2B:
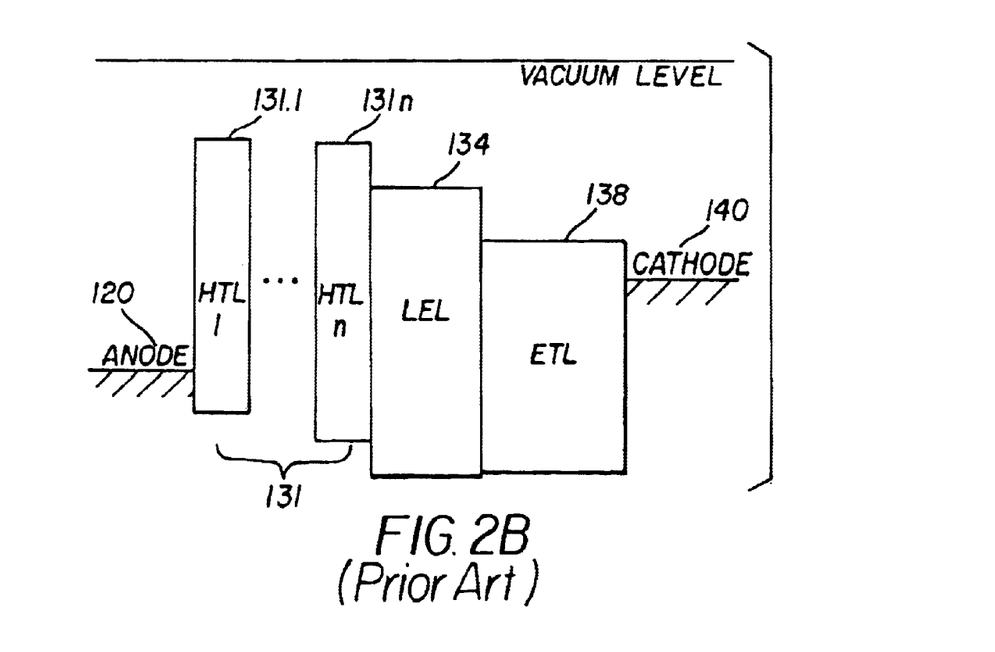
Figure 3A:
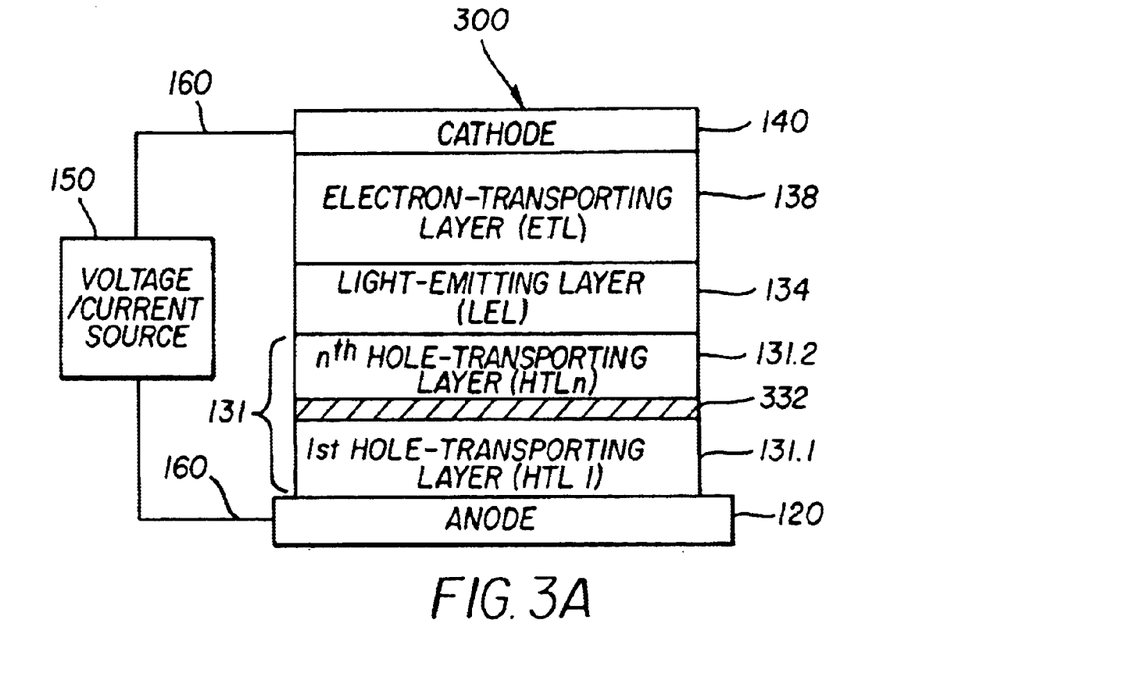

FIG. 3 shows an OLED 300 in accordance with the present invention. OLED 300 has an anode 120 and a cathode 140, at least one of which is transparent. Disposed between the anode 120 and the cathode 140 are at least an HTR 131, a LEL 134, and an ETL 138, wherein the HTR 131 contains at least a metal sub-layer 332, an HTL 131.1 (HTL 1) and an HTL 131.2 (HTL 2). This device is externally connected to a voltage/current source 150 through electrical conductors 160.

Metal Sub-Layer in the Hole-Transporting Region

Figure 3B:
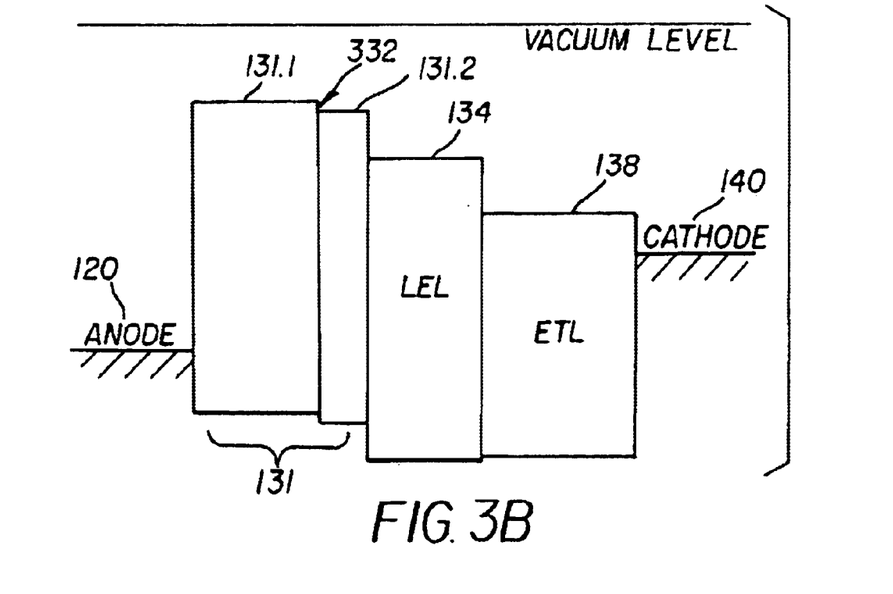

As aforementioned, multilayered HTLs or doped HTL (or doped HIL) can substantially improve the luminous efficiency but may deteriorate the device lifetime. However, we found that inserting a monolayer of high work-function metal (by high work-function, it meant the work function is higher than 4.0 eV) within the HTR can improve the luminous efficiency without compromising the operational stability. We believe that when metal deposits on an HTL, charge transfer can occur in both organic layer and the metal layer. This charge transfer will result in a downshifting of the Ip (away from the vacuum energy level) of the organic layer on its surface region. When the next HTL is deposited on the top of the previous HTL having a monolayer of metal layer on the surface, it forms a hole-injection barrier between the two HTLs accordingly. This hole-injection barrier height can be in a range of from more than 1 eV to less than 0.1 eV depending on the work-function of the metal in between the two HTLs and the electronic structure of the organic materials in the HTLs. If a monolayer of a high work-function metal is deposited in between two HTLs, it can form a hole-injection barrier with a barrier height less than 0.4 eV. Creating a hole-injection barrier less than 0.4 eV between two HTLs having the same hole-transporting material can slow down the hole-injection and increase luminous efficiency without deteriorate the operational stability of the device. Shown in FIG. 3B is the corresponding electron energy band diagram of an OLED having a metal sub-layer in the HTR in FIG. 3A.

This metal sub-layer disposed within the hole-transporting region contains at least one metal selected from group 4 through group 16 of the Periodic Table of Elements and the selected metal has a work-function higher than 4.0 eV. The metal sub-layer contains at least one metal including Al, Ti, V, Cr, Fe, Co, Ni, Cu, Zn, Ga, Zr, Nb, Mo, Ru, Rh, Pd, Ag, Cd, In, Sn, Sb, Te, Ta, W, Re, Os, Ir, Pt, Au or Pb. Preferably, the metal sub-layer contains at least one metal including Al, Ni, Cu, Zn, Ga, Mo, Pd, Ag, In, Sn, Pt or Au. More preferably, the metal sub-layer contains one of the metals selected from Al, Cu, Ag, or Au. From the fabrication point of view, in order to reduce the number of material sources and simplify the fabrication process, the metal sub-layer can be formed using a high work-function metal wherein the metal is regularly used to form an electrode in the OLEDs. For example, if there is an Al source in the deposition chamber used to form LiF/Al cathode, the Al metal can be used to form the metal sub-layer in the HTR;

and if there is an Ag source in the deposition chamber used to form MgAg alloy cathode, the Ag metal can be used to form the metal sub-layer in the HTR.

This metal sub-layer can be less than 10 nm in thickness. Preferably, it can be less than 1 nm. Actually, it is also useful even when the metal sub-layer is as thin as 0.05 nm. The distance between the metal sub-layer and the light-emitting layer is in the range of from 2 nm to 30 nm. Preferably, the distance is in the range of from 5 nm to 20 nm. In other words, the thickness of the second HTL is in the range of from 2 nm to 30 nm, and preferably, it is in the range from 5 nm to 20 nm.

This metal sub-layer is inserted between two HTLs, wherein each of the HTLs contains at least one hole-transporting material selected from aromatic tertiary amines, or selected from polycyclic aromatic compounds. Preferably, it contains a hole-transporting material selected from NPB, or N,N,N',N'-tetrakis(naphtha-2-yl)-benzidine (TNB). From the fabrication point of view, the metal sub-layer is inserted between two HTLs, wherein the two HTLs contain the same hole-transporting material.

Substrate

The OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course, it is necessary to provide in these device configurations a light-transparent top electrode.

Anode

When EL emission is viewed through anode 120, the anode should be transparent or substantially transparent to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque or reflective. Example conductors for this application include, but are not limited to, gold, iridium, molybdenum, palladium, and platinum. Typical anode materials, transmissive or otherwise, have a work function higher than 4.0 eV. Desired anode materials are commonly deposited by any suitable means such as evaporation, sputtering, chemical vapor deposition, or electrochemical means. Anodes can be patterned using well known photolithographic processes. Optionally, anodes may be polished prior to the deposition of other layers to reduce surface roughness so as to minimize electrical shorts or enhance reflectivity.

Hole-Transporting Layer (HTL)

There are at least two HTLs in HTR 131. Preferably, the two HTLs include the same hole-transporting material. Each HTL contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an aryl amine, such as a mono aryl amine, diarylamine, triarylamine, or a polymeric aryl amine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4-(di-p-tolylamino)-styryl]stilbene
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the LEL 134 in OLED 300 includes a luminescent or fluorescent material where electroluminescence is produced as a result of electron-hole pair recombination in this region. The LEL can be comprised of a single material, but more commonly consists of a host material doped with a guest compound or compounds where light emission comes primarily from the dopant and can be of any color. The host materials in the LEL can be an electron-transporting material, a hole-transporting material, or another material or combination of materials that support hole-electron recombination. The dopant is usually selected from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc(II)
CO-4: Bis(2-methyl-8-quinolinolato)aluminum(III)-$\mu$-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)].

Other classes of useful host materials include, but are not limited to, derivatives of anthracene, such as 2-(1,1-dimethyethyl)-9,10-bis(2-naphthalenyl) anthracene (TBADN), 9,10-di-(2-naphthyl) anthracene (ADN), and derivatives thereof as described in U.S. Pat. No. 5,935,721, distyrylarylene derivatives as described in U.S. Pat. No. 5,121,029, benzazole derivatives, for example, 2,2',2"-(1,3,5-phenylene)tris[1-phenyl-1H-benzimidazole], and blue emitting metal chelated oxinoid compounds, for example, Bis(2-methyl-8-quinolinolato)(4-phenylphenolato) aluminum (B-Alq). Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

Electron-Transporting Layer (ETL)

Preferred thin film-forming materials for use in forming the ETL in the OLED of the present invention are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo {f}-8-quinolinolato]zinc(II)
CO-4: Bis(2-methyl-8-quinolinolato)aluminum(III)-$\mu$-oxo-bis(2-methyl-8-quinolinolato) aluminum(II)
CO-5: Indium trisoxine [alias, tris(8-quinotinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, and some silole derivatives are also useful electron-transporting materials.

Electron-Injecting Layer (EIL)

While not always necessary, it is often useful to provide an EIL in contact to the cathode 140. The EIL can serve to facilitate injection of electrons into the ETL and to increase the electrical conductivity resulting in a low driving voltage of the OLED as described in U.S. Pat. No. 6,013,384. Suitable materials for use in the EIL are the aforementioned ETL with strong reducing agents as dopants or with low work function metals (<3.0 eV) as dopants to form an n-type doped organic layer. An n-type doped organic layer means that the layer is electrically conductive, and the charge carriers are primarily electrons. The conductivity is provided by the formation of a charge-transfer complex as a result of electron transfer from the dopant material to the host material. Alternative inorganic electron-injecting materials can also be useful to form an EIL in the OLED. The inorganic EIL preferably includes a low work-function metal or metal salt, such as a 0.5~1 nm LiF layer as described in U.S. Pat. No. 5,677,572.

Cathode

When light emission is viewed solely through the anode, the cathode 140 used in the present invention can be comprised of nearly any conductive material. Desirable materials have good film-forming properties to ensure good contact with the underlying organic layer, promote electron injection at low voltage, and have good stability. Useful cathode materials often contain a low work-function metal (<4.0 eV) or metal alloy. One preferred cathode material is comprised of a MgAg alloy wherein the percentage of silver is in the range of 1 to 20%, as described in U.S. Pat. No. 4,885,221. Another suitable class of cathode materials includes bilayers comprising a thin inorganic EIL (as aforementioned) in contact with an organic layer (e.g., ETL), which is capped with a thicker layer of a conductive metal. If the inorganic EIL includes a low work-function metal or metal salt, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; JP 3,234,963; and EP 1 076 368. Cathode materials are typically deposited by thermal evaporation, electron-beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

Alternative Layers

In some instances, LEL and ETL in the organic EL units can optionally be collapsed into a single layer that serves the function of supporting both light emission and electron-transportation; and organic EIL can optionally be named as the ETL that serves the function of supporting both electron-injection and electron-transport. It is also known in the art that emitting dopants may be added to an HTL, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in U.S. Patent Application Publication 2002/0025419 A1; U.S. Pat. Nos. 5,683,823; 5,503,910; 5,405,709; 5,283,182; EP 1 187 235; and EP 1 182 244.

Additional layers such as electron or hole-blocking layers as taught in the art may be employed in devices of the present invention. Hole-blocking layers are commonly used to improve efficiency of phosphorescent emitter devices, for example, as in U.S. Patent Application Publication 2002/0015859 A1.

Deposition of Organic Layers

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be pre-mixed and coated from a single boat or donor sheet. For full color display, the pixelation of LELs may be needed. This pixelated deposition of LELs can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Encapsulation

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of the present invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention can be employed in most OLED configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

The entire contents of the patents and other publications referred to in this specification are incorporated herein by reference.

EXAMPLES

The present invention and its advantages can be better appreciated by the following inventive and comparative examples. For purposes of brevity, the materials and layers formed therefrom will be abbreviated as given below.

ITO: indium-tin-oxide; used in forming the transparent anode on glass substrates.

CFx: polymerized fluorocarbon layer; used in forming a hole-injecting layer on top of ITO.

CuPc: Copper phthalocyanine; used in form a hole-transporting layer (or called as hole-injecting layer) in hole-transporting region.

NPB: N,N'-bis(1-naphthyl)-N,N'-diphenyl-1,1'-biphenyl-4,4'-diamine; used in forming the hole-transporting layer.

TPD: 4,4'-bis(3-methylphenylphenylamino)biphenyl; used in forming the hole-transporting layer.

Alq: tris(8-hydroxyquinoline)aluminum(III); used in forming the electron-transporting layer, or in forming an organic sub-layer in hole-transporting region.

TBADN: 2-(1,1-dimethyethyl)-9,10-bis(2-naphthalenyl)anthracene; used as the host material in forming the light-emitting layer; or used in forming an organic sub-layer in hole-transporting region.

TBP: 2,5,8,11-tetra-t-butylperylene; used as the dopant material in the light-emitting layer.

Li: Lithium; used in forming the metal sub-layer in hole-transporting region; or used as a dopant in an ETL to improve the electron-transporting properties.

Ag: Silver; used in form the metal sub-layer in HTR or in forming a cathode with magnesium.

MgAg: magnesium:silver at a ratio of 10:0.5 by volume; used in forming the cathode.

In the following examples, the thickness of the organic layers and the doping concentrations were controlled and measured in situ using calibrated thickness monitors (INFICON IC/5 Deposition Controller). The electroluminescence characteristics of all the fabricated devices were evaluated using a constant current source (KEITHLEY 2400 SourceMeter) and a photometer (PHOTO RESEARCH SpectraScan PR 650) at room temperature. The color will be reported using Commission Internationale de l'Eclairage (CIE) coordinates. Ionization potential (Ip) of some organic thin films was measured using an ultraviolet photoelectron spectroscopy in a photoelectron spectroscopy system (THERMO VG THERMAL ESCALAB-250). During the operational stability test, some devices being tested were driven at a current density of 20 mA/cm$^2$ in a 70° C. oven (VWR Scientific Products), and some other devices being tested were driven at a current density of 20 mA/cm$^2$ under the room temperature condition.

Example 1 (OLED—Comparative Example)

The preparation of a conventional OLED is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing CHF$_3$ gas in an RF plasma treatment chamber. The substrate was then transferred into a vacuum deposition chamber (TROVATO MFG. INC) for deposition of all other layers on top of the substrate. The following layers were deposited in the following sequence by evaporation from a heated boat under a vacuum of approximately 10$^{-6}$ Torr:

(1) a HTR, 75 nm thick, having only one HTL consisting of NPB;
(2) a LEL, 20 nm thick, consisting of Alq;
(3) an ETL, 40 nm thick, consisting of Alq as well; and
(4) a cathode, approximately 210 nm thick, consisting of MgAg.

Figure 4:
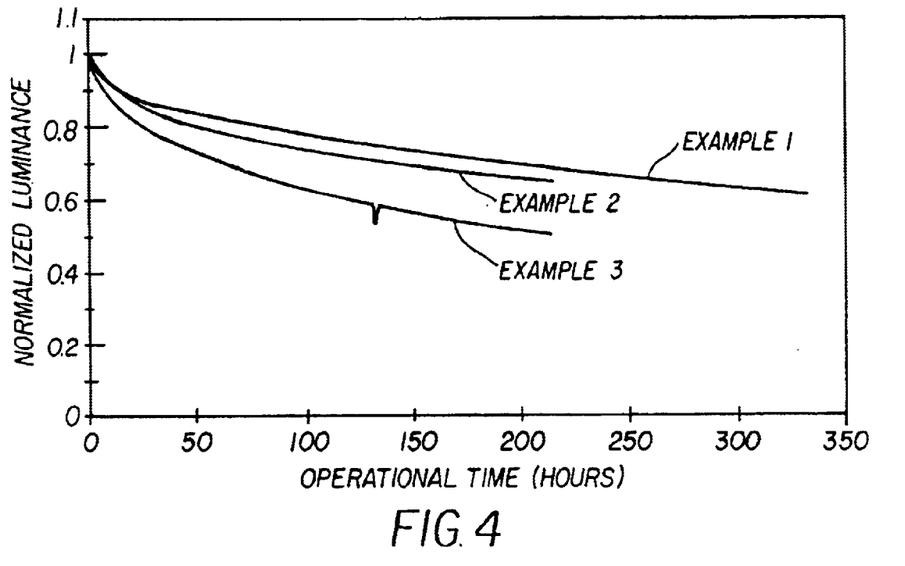

After the deposition of these layers, the device was transferred from the deposition chamber into a dry box (VAC Vacuum Atmosphere Company) for encapsulation. The completed device structure is denoted as ITO/CFx/NPB(75)/Alq(20)/Alq(40)/MgAg. Shown in Table I is the EL performance of the device, i.e., the drive voltage, luminance, luminous efficiency, power efficiency, CIEx, CIEy, and the 70%-luminance remaining time (an operational time at which the luminance remains 70% of its initial value, and which is denoted as $T_{70}$(70° C.) in the present invention), when the device is measured at a current density of 20 mA/cm$^2$. The normalized luminance vs. operational time is shown in FIG. 4.

Example 2 (Comparative Example)

An OLED was constructed in the manner described in Example 1, except in Step 1 wherein the 75-nm-thick HTR is now replaced by two HTLs, one is HTL 1 consisting of a 37.5-nm-thick NPB layer, and the other is HTL 2 consisting of a 37.5-nm-thick TPD layer. The completed device structure is denoted as ITO/CFx/NPB(37.5)/TPD(37.5)/Alq(20)/Alq(40)/MgAg. Shown in Table I is the EL performance of the device, i.e. the drive voltage, luminance, luminous efficiency, power efficiency, CIEx, CIEy, and the $T_{70}$(70° C.), when the device is measured at a current density of 20 mA/cm$^2$. The normalized luminance vs. operational time is shown in FIG. 4.

Example 3 (Comparative Example)

An OLED was constructed in the manner described in Example 1, except in Step 1 wherein the 75-nm-thick HTR is now replaced by three HTLs, one is HTL 1 consisting of a 25-nm-thick CuPc layer, one is HTL 2 consisting of a 25-nm-thick NPB layer, and the other is HTL 3 consisting of a 25-nm-thick TPD layer. The completed device structure is denoted as ITO/CFx/CuPc(25)/NPB(25)/TPD(25)/Alq(20)/Alq(40)/MgAg. Shown in Table I is the EL performance of the device, i.e. the drive voltage, luminance, luminous efficiency, power efficiency, CIEx, CIEy, and the $T_{70}$(70° C.), when the device is measured at a current density of 20 mA/cm$^2$. The normalized luminance vs. operational time is shown in FIG. 4.

TABLE I

| Example (Type) (EL measured at 20 mA/cm$^2$) | Voltage (V) | Luminance (cd/m$^2$) | Luminous Efficiency (cd/A) | Power Efficiency (lm/W) | CIE x | CIE y | $T_{70}$ (70° C.) (Hrs) |
|---|---|---|---|---|---|---|---|
| 1 (Comparative) | 6.89 | 489 | 2.44 | 1.12 | 0.322 | 0.543 | 200 |
| 2 (Comparative) | 6.35 | 428.6 | 2.14 | 1.06 | 0.338 | 0.542 | 150 |
| 3 (Comparative) | 8.33 | 626.5 | 3.13 | 1.18 | 0.313 | 0.561 | 65 |

From the data shown in Table I, we can notice that multilayered HTLs may not be able to improve the EL performance. The operational stability, indicated by the 70%-luminance remaining time at 70° C., is reduced with the increasing number of the HTLs.

Example 4 (OLED-Comparative Example)

Figure 5:
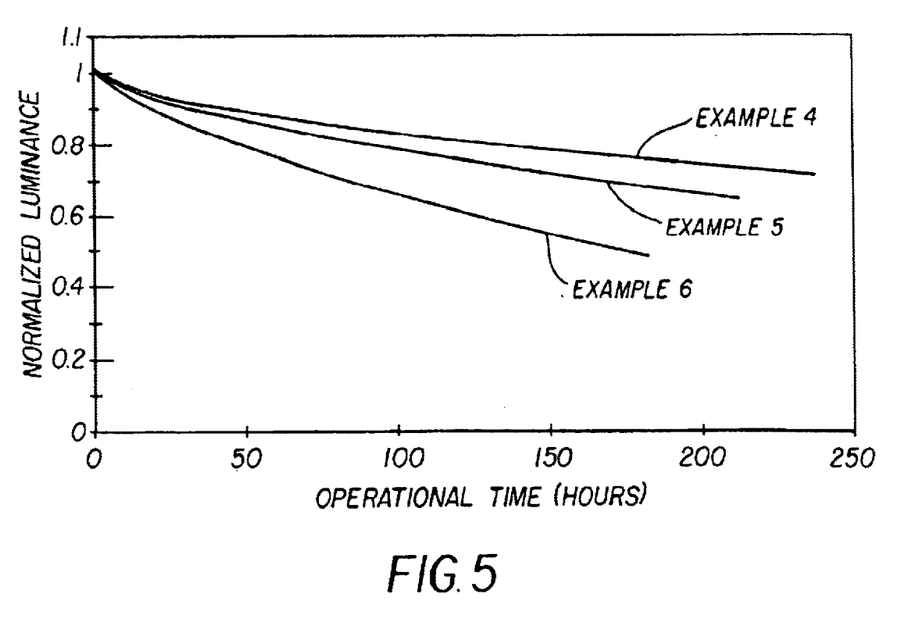

An OLED was constructed in the manner described in Example 1, except in Step 1 wherein the thickness of the HTR is now changed from 75 nm to 100 nm, and except in Step 2 wherein the LEL is now a 20-nm-thick TBADN doped with 2% TBP in volume. This device is emitting blue color when it is driven electrically. The completed device structure is denoted as ITO/CFx/NPB(100)/TBADN:TBP(20)/Alq(40)/MgAg. Shown in Table II is the EL performance of the device, i.e. the drive voltage, luminance, luminous efficiency, power efficiency, CIEx, CIEy, and the $T_{70}$(70° C.), when the device is measured at a current density of 20 mA/cm$^2$. The normalized luminance vs. operational time is shown in FIG. 5.

Example 5 (Comparative Example)

An OLED was constructed in the manner described in Example 4, except in Step 1 wherein the 100-nm-thick HTR is now replaced by three layers, one is HTL 1 consisting of a 50-nm-thick NPB layer, one is an organic sub-layer consisting of a 2-nm-thick TBADN layer, and the other is HTL 2 consisting of a 50-nm-thick NPB layer. In other words, a 2-nm-thick TBADN organic sub-layer was inserted in the HTR consisting of NPB material. The completed device structure is denoted as ITO/CFx/NPB(50)/TBADN (2)/NPB(50)/TBADN:TBP(20)/Alq(40)/MgAg. Shown in Table II is the EL performance of the device, i.e. the drive voltage, luminance, luminous efficiency, power efficiency, CIEx, CIEy, and the $T_{70}(70°$ C.), when the device is measured at a current density of 20 mA/cm$^2$. The normalized luminance vs. operational time is shown in FIG. 5.

Example 6 (Comparative Example)

An OLED was constructed in the manner described in Example 4, except in Step 1 wherein the 100-nm-thick HTR is now replaced by three layers, one is HTL 1 consisting of a 50-nm-thick NPB layer, one is an organic sub-layer consisting of a 2-nm-thick Alq layer, and the other is HTL 2 consisting of a 50-nm-thick NPB layer. In other words, a 2-nm-thick Alq organic sub-layer was inserted in the HTR consisting of NPB material. The completed device structure is denoted as ITO/CFx/NPB(50)/Alq(2)/NPB(50)/TBADN:TBP(20)/Alq(40)/MgAg. Shown in Table II is the EL performance of the device, i.e. the drive voltage, luminance, luminous efficiency, power efficiency, CIEx, CIEy, and the $T_{70}(70°$ C.), when the device is measured at a current density of 20 mA/cm$^2$. The normalized luminance vs. operational time is shown in FIG. 5.

Example 8 (Comparative Example)

Figure 6:
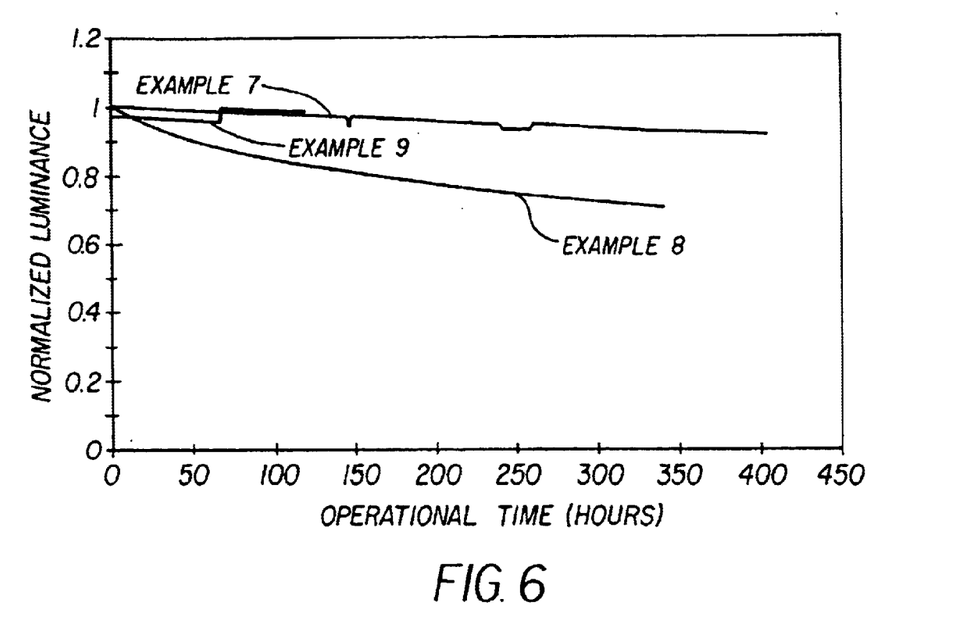

An OLED was constructed in the manner described in Example 7, except in Step 1 wherein the 75-nm-thick HTR is now replaced by three layers, one is HTL 1 consisting of a 55-nm-thick NPB layer, one is a metal sub-layer consisting of a 0.05-nm-thick Li, and the other is HTL 2 consisting of a 20-nm-thick NPB layer. In other words, a 0.05-nm-thick Li sub-layer was inserted in the HTR consisting of NPB material. The completed device structure is denoted as ITO/CFx/NPB(55)/Li(0.05)/NPB(20)/Alq(40)/MgAg. Shown in Table III is the EL performance of the device, i.e. the drive voltage, luminance, luminous efficiency, power efficiency, CIEx, CIEy, and the $T_{90}(RT)$, when the device is measured at a current density of 20 mA/cm$^2$. The normalized luminance vs. operational time is shown in FIG. 6.

Example 9 (Working Example)

An OLED was constructed in the manner described in Example 7, except in Step 1 wherein the 75-nm-thick HTR is now replaced by three layers, one is HTL 1 consisting of a 55-nm-thick NPB layer, one is a metal sub-layer consisting of a 0.05-nm-thick Ag, and the other is HTL 2 consisting of a 20-nm-thick NPB layer. In other words, a 0.05-nm-thick Ag sub-layer was inserted in the HTR consisting of NPB

TABLE II

| Example (Type) (EL measured at 20 mA/cm$^2$) | Voltage (V) | Luminance (cd/m$^2$) | Luminous Efficiency (cd/A) | Power Efficiency (lm/W) | CIE x | CIE y | $T_{70}$ (70° C.) (Hrs) |
|---|---|---|---|---|---|---|---|
| 4 (Comparative) | 6.94 | 475.1 | 2.38 | 1.08 | 0.142 | 0.208 | 230 |
| 5 (Comparative) | 9.50 | 643.8 | 3.22 | 1.06 | 0.142 | 0.217 | 145 |
| 6 (Comparative) | 11.95 | 619.6 | 3.10 | 0.81 | 0.142 | 0.220 | 60 |

From the data shown in Table II, we can realize that an organic sub-layer can improve the luminous efficiency but it severely deteriorates the operational stability.

Example 7 (OLED-Comparative Example)

Another conventional OLED was constructed in the manner described in Example 1. The completed device structure is denoted as ITO/CFx/NPB(75)/Alq(20)/Alq(40)/MgAg. Shown in Table III is the EL performance of the device, i.e. the drive voltage, luminance, luminous efficiency, power efficiency, CIEx, CIEy, and the $T_{90}(RT)$ (a 90%-luminance remaining time tested at the room temperature), when the device is measured at a current density of 20 mA/cm$^2$. The normalized luminance vs. operational time is shown in FIG. 6.

material. The completed device structure is denoted as ITO/CFx/NPB(55)/Ag(0.05)/NPB(20)/Alq(40)/MgAg. Shown in Table III is the EL performance of the device, i.e. the drive voltage, luminance, luminous efficiency, power efficiency, CIEx, CIEy, and the $T_{90}(RT)$, when the device is measured at a current density of 20 mA/cm$^2$. The normalized luminance vs. operational time is shown in FIG. 6.

TABLE III

| Example (Type) (EL measured at 20 mA/cm$^2$) | Voltage (V) | Luminance (cd/m$^2$) | Luminous Efficiency (cd/A) | Power Efficiency (lm/W) | CIE x | CIE y | $T_{90}$ (RT) (Hrs) |
|---|---|---|---|---|---|---|---|
| 7 (Comparative) | 7.68 | 554 | 2.77 | 1.13 | 0.326 | 0.549 | >400 |
| 8 (Comparative) | 12.12 | 846 | 4.23 | 1.10 | 0.327 | 0.548 | 55 |
| 9 (Inventive) | 8.71 | 719 | 3.59 | 1.30 | 0.327 | 0.550 | >400 |

From the data shown in Table III, we can realize that a metal sub-layer can improve the luminous efficiency. However, if the metal sub-layer consists of a low work-function metal, it severely deteriorates the operational stability. A metal sub-layer consists of a high work-function metal can maintain the operational stability while improving the luminous efficiency.

Example 10 (OLED-Comparative Example)

Figure 7:
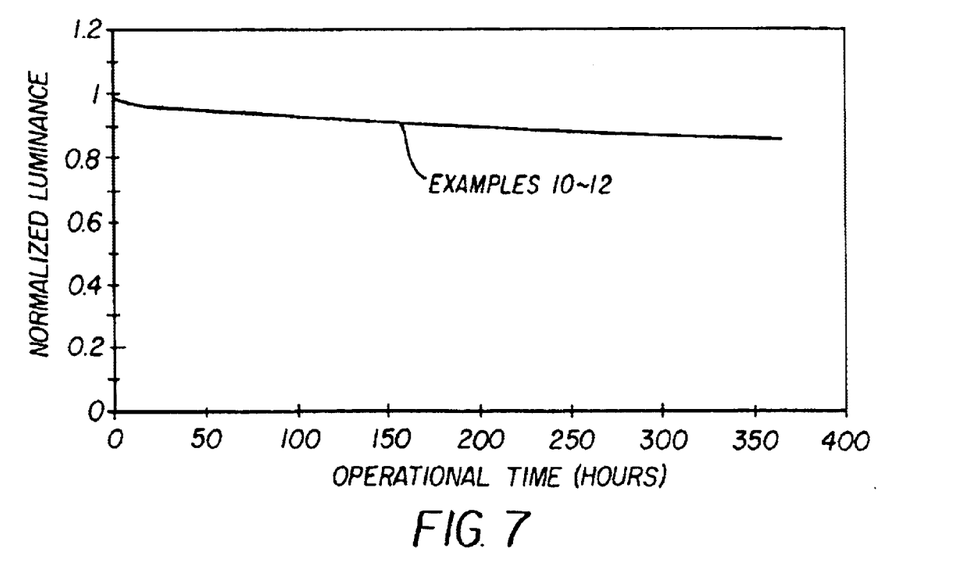

An OLED was constructed in the manner described in Example 7, except in Step 2 wherein the thickness of the LEL is now changed from 20 nm into 25 nm, and in Step 3 wherein the ETL is now replaced by a 35-nm-thick Alq doped with 1.2% Li in volume for conductivity improvement. The completed device structure is denoted as ITO/CFx/NPB(75)/Alq(25)/Alq:Li(35)/MgAg. Shown in Table IV is the EL performance of the device, i.e. the drive voltage, luminance, luminous efficiency, power efficiency, CIEx, CIEy, and the $T_{90}(RT)$ (a 90%-luminance remaining time tested at the room temperature), when the device is measured at a current density of 20 mA/cm$^2$. The normalized luminance vs. operational time is shown in FIG. 7.

Example 11 (Working Example)

An OLED was constructed in the manner described in Example 10, except in Step 1 wherein the 75-nm-thick HTR is now replaced by three layers, one is HTL 1 consisting of a 70-nm-thick NPB layer, one is a metal sub-layer consisting of a 0.05-nm-thick Ag, and the other is HTL 2 consisting of a 5-nm-thick NPB layer. The completed device structure is denoted as ITO/CFx/NPB(70)/Ag(0.05)/NPB(5)/Alq(25)/Alq:Li(35)/MgAg. Shown in Table IV is the EL performance of the device, i.e. the drive voltage, luminance, luminous efficiency, power efficiency, CIEx, CIEy, and the $T_{90}(RT)$, when the device is measured at a current density of 20 mA/cm$^2$. The normalized luminance vs. operational time is shown in FIG. 7.

Example 12 (Working Example)

An OLED was constructed in the manner described in Example 10, except in Step 1 wherein the 75-nm-thick HTR is now replaced by three layers, one is HTL 1 consisting of a 65-nm-thick NPB layer, one is a metal sub-layer consisting of a 0.05-nm-thick Ag, and the other is HTL 2 consisting of a 10-nm-thick NPB layer. The completed device structure is denoted as ITO/CFx/NPB(65)/Ag(0.05)/NPB(10)/Alq(40)/MgAg. Shown in Table IV is the EL performance of the device, i.e. the drive voltage, luminance, luminous efficiency, power efficiency, CIEx, CIEy, and the $T_{90}(RT)$, when the device is measured at a current density of 20 mA/cm$^2$. The normalized luminance vs. operational time is shown in FIG. 7.

Parts List

- 100 OLED (prior art)
- 200 OLED having multilayered HTLs (prior art)
- 300 OLED (present invention)
- 120 Anode
- 131 Hole-transporting Region, HTR
- 131.1 1$^{st}$ hole-transporting layer, HTL 1
- 131.2 2$^{nd}$ hole-transporting layer, HTL 2
- 131.n n$^{th}$ hole-transporting layer, HTL n
- 134 Light-emitting layer, LEL
- 138 Electron-transporting layer, ETL
- 140 Cathode
- 332 Metal sub-layer

What is claimed is:

1. An organic electroluminescent device comprising:

a) an anode;

b) a hole-transporting region disposed over the anode; wherein the hole-transporting region contains at least one hole-transporting material;

c) a metal sub-layer disposed within the hole-transporting region; wherein the metal sub-layer contains at least one metal selected from group 4 through group 16 of the Periodic Table of Elements and the selected metal has a work-function higher than 4.0 eV;

d) a light-emitting layer formed in contact with the hole-transporting region for producing light in response to hole-electron recombination;

e) an electron-transporting layer disposed over the light-emitting layer; and f) a cathode disposed over the electron-transporting layer.

2. The organic electroluminescent device of claim 1 wherein the thickness of the metal sub-layer is less than 10 nm.

3. The organic electroluminescent device of claim 1 wherein the thickness of the metal sub-layer is less than 1 nm.

4. The organic electroluminescent device of claim 1 wherein the distance between the metal sub-layer and the light-emitting layer is in the range of from 2 nm to 30 nm.

TABLE IV

| Example (Type) (EL measured at 20 mA/cm$^2$) | Voltage (V) | Luminance (cd/m$^2$) | Luminous Efficiency (cd/A) | Power Efficiency (lm/W) | CIE x | CIE y | $T_{90}$ (RT) (Hrs) |
|---|---|---|---|---|---|---|---|
| 10 (Comparative) | 6.34 | 656 | 3.30 | 1.64 | 0.325 | 0.557 | >200 |
| 11 (Inventive) | 6.78 | 865 | 4.33 | 2.01 | 0.327 | 0.559 | >200 |
| 12 (Inventive) | 6.96 | 864 | 4.32 | 1.95 | 0.328 | 0.559 | >200 |

From the data shown in Table IV and from the overlapped stability curves in FIG. 7, we can realize that when a high work-function metal sub-layer in the HTR is placed closer to the LEL, it can still improve the luminous efficiency while maintain the same operational stability without metal diffusion problem.

The invention has been described in detail with particular reference to certain preferred embodiments thereof, but it will be understood that variations and modifications can be effected within the spirit and scope of the invention.

5. The organic electroluminescent device of claim 1 wherein the distance between the metal sub-layer and the light-emitting layer is in the range of from 5 nm to 20 nm.

6. The organic electroluminescent device of claim 1 wherein the metal sub-layer includes at least one metal selected from the group consisting of Al, Ti, V, Cr, Fe, Co, Ni, Cu, Zn, Ga, Zr, Nb, Mo, Ru, Rh, Pd, Ag, Cd, In, Sn, Sb, Te, Ta, W, Re, Os, Ir, Pt, Au or Pb.

7. The organic electroluminescent device of claim 1 wherein the metal sub-layer includes at least one metal selected from the group consisting of Al, Ni, Cu, Zn, Ga, Mo, Pd, Ag, In, Sn, Pt and Au.

8. The organic electroluminescent device of claim 1 wherein the metal sub-layer includes at least one metal selected from the group consisting of Al, Cu, Ag and Au.

9. The organic electroluminescent device of claim 1 wherein the hole-transporting region containing at least one hole-transporting material is selected from aromatic tertiary amines.

10. The organic electroluminescent device of claim 1 wherein the hole-transporting region containing at least one hole-transporting material is selected from polycyclic aromatic compounds.

11. The organic electroluminescent device of claim 1 wherein the hole-transporting region containing at least one hole-transporting material is selected from NPB or TNB.

* * * * *